United States Patent
Tanahashi et al.

(10) Patent No.: US 9,306,731 B2
(45) Date of Patent: Apr. 5, 2016

(54) SIGNAL PROCESSING APPARATUS

(71) Applicant: KABUSHIKI KAISHA TOSHIBA, Minato-ku, Tokyo (JP)

(72) Inventors: Makoto Tanahashi, Yokohama Kanagawa (JP); Yoshimasa Egashira, Kawasaki Kanagawa (JP); Atsushi Yamaoka, Kawasaki Kanagawa (JP); Keiichi Yamaguchi, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/594,740

(22) Filed: Jan. 12, 2015

(65) Prior Publication Data

US 2015/0249533 A1    Sep. 3, 2015

(30) Foreign Application Priority Data

Feb. 28, 2014  (JP) .................................. 2014-038881

(51) Int. Cl.

| | |
|---|---|
| H04K 1/02 | (2006.01) |
| H04L 25/03 | (2006.01) |
| H04L 25/49 | (2006.01) |
| H04L 7/00 | (2006.01) |
| H04L 27/36 | (2006.01) |
| H03F 3/21 | (2006.01) |
| H03F 3/19 | (2006.01) |

(52) U.S. Cl.

CPC ................ *H04L 7/0041* (2013.01); *H03F 3/19* (2013.01); *H03F 3/211* (2013.01); *H04L 7/0091* (2013.01); *H04L 27/367* (2013.01); *H03F 2200/451* (2013.01); *H03F 2203/21106* (2013.01)

(58) Field of Classification Search

CPC ....... H03F 1/0222; H03F 1/32; H03F 1/3282; H03F 2200/451; H03F 2203/21106; H03F 3/19
USPC .................................................. 375/295, 297
See application file for complete search history.

(56) References Cited

U.S. PATENT DOCUMENTS

| | | | |
|---|---|---|---|
| 6,043,707 A * | 3/2000 | Budnik ........................... | 330/10 |
| 7,383,028 B2 | 6/2008 | Suzuki et al. | |
| 2005/0079835 A1 * | 4/2005 | Takabayashi et al. ...... | 455/127.1 |
| 2005/0191976 A1 * | 9/2005 | Shakeshaft et al. ........... | 455/118 |
| 2008/0233904 A1 | 9/2008 | Suzuki et al. | |
| 2009/0097591 A1 * | 4/2009 | Kim .............................. | 375/297 |

FOREIGN PATENT DOCUMENTS

JP   2005203960 A   7/2005

* cited by examiner

*Primary Examiner* — Freshteh N Aghdam
(74) *Attorney, Agent, or Firm* — Holtz, Holtz & Volek PC

(57) ABSTRACT

According to an embodiment, a signal processing apparatus includes a first switch, a second switch, a corrector and a circuit. The first switch selects one signal from a first signal group including a first signal and a first constant envelope signal to obtain a first selected signal. The second switch selects one signal from a second signal group including a second signal and a second constant envelope signal to obtain a second selected signal. The corrector corrects a characteristic of at least one of the first and second selected signals to obtain a first corrected signal and a second corrected signal. The circuit generates an output signal from the first corrected signal and the second corrected signal.

10 Claims, 9 Drawing Sheets

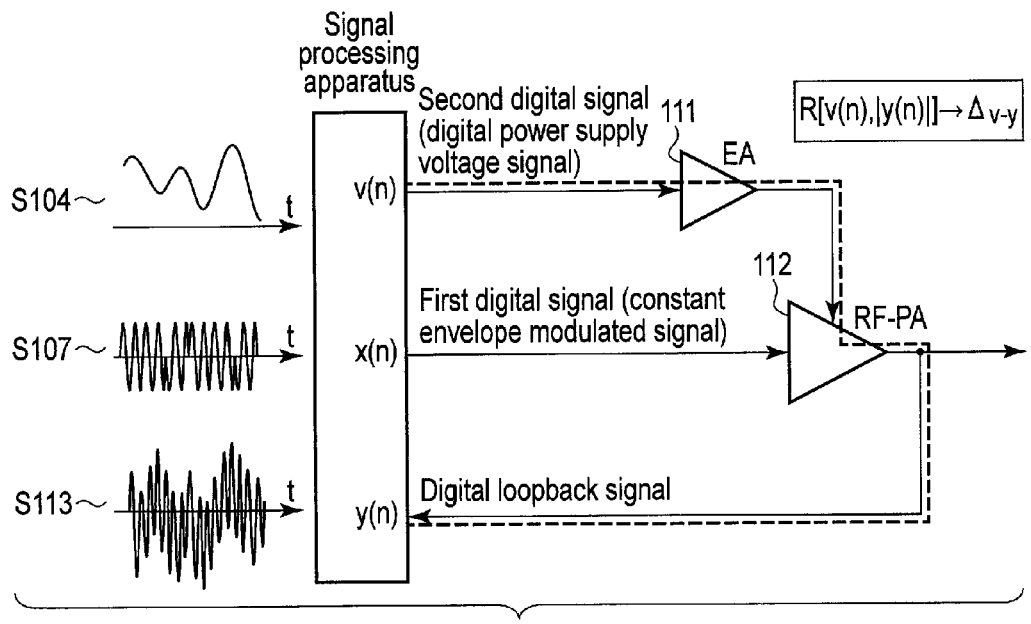
F I G. 4
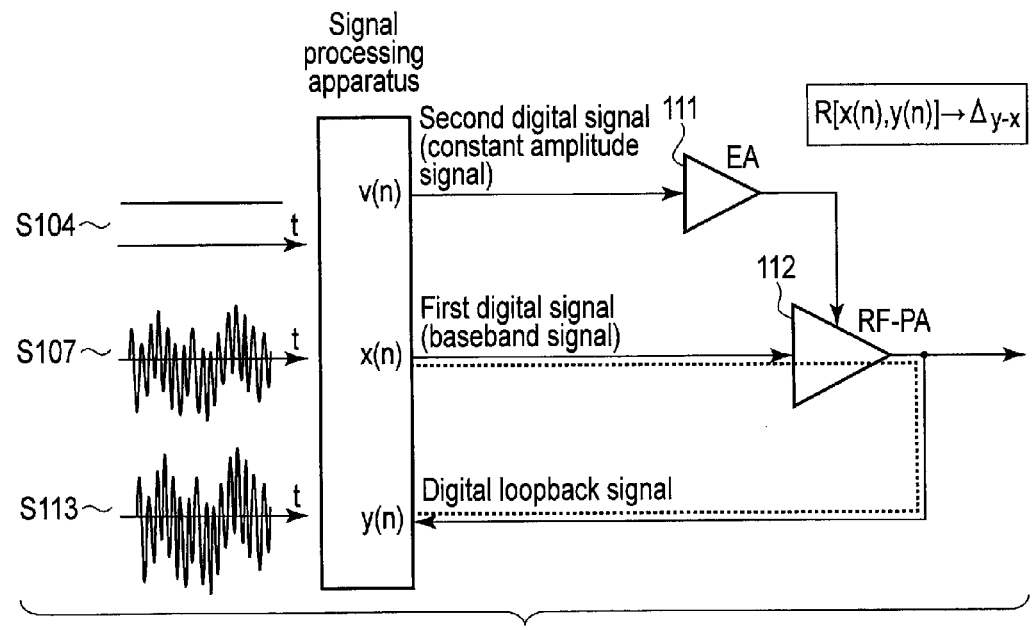
F I G. 5

| | v(t) | x(t) |
|---|---|---|
| When $\Delta_{y-x}$ is estimated | 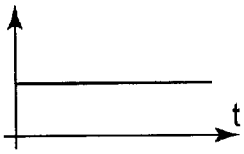<br>Switch 106 selects input terminal B | 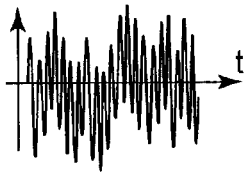<br>Switch 105 selects input terminal A |
| When $\Delta_{v-y}$ is estimated | 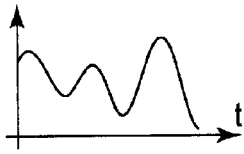<br>Switch 106 selects input terminal A | 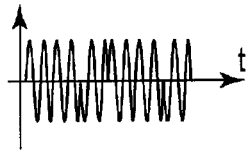<br>Switch 105 selects input terminal B |
| Normal state | <br>Switch 106 selects input terminal A | <br>Switch 105 selects input terminal A |
F I G. 6

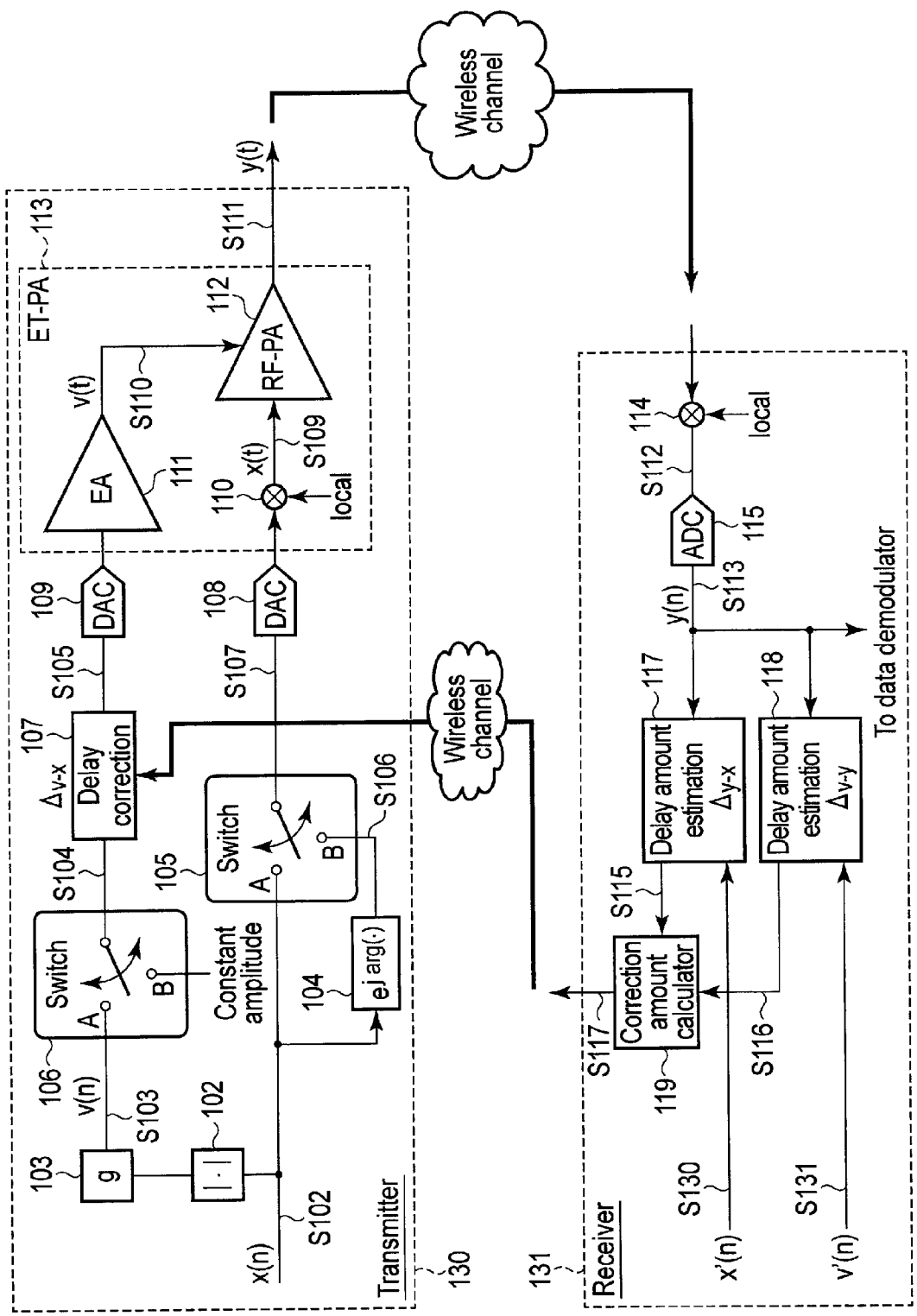
F I G. 7

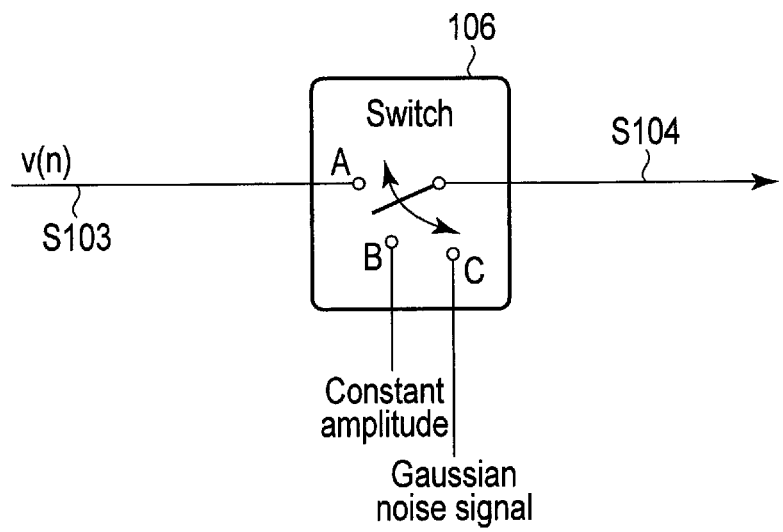
F I G. 8
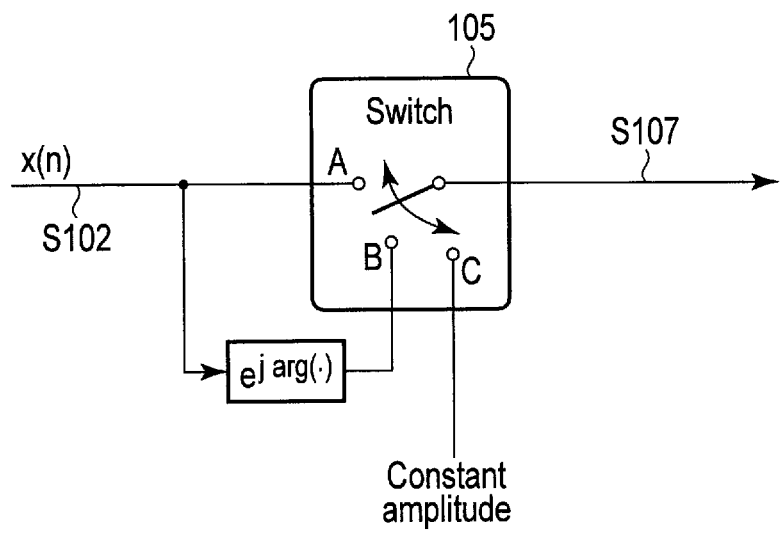
F I G. 9

| | v(t) | x(t) |
|---|---|---|
| When $\Delta_{y-x}$ is estimated | 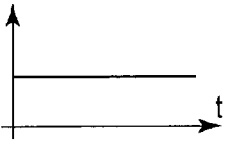<br>Switch 106 selects input terminal B | <br>Switch 105 selects input terminal A |
| When $\Delta_{v-y}$ is estimated | 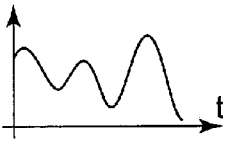<br>Switch 106 selects input terminal A<br>or<br>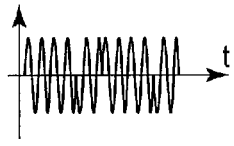<br>switch 106 selects input terminal C (Gaussian noise signal with a large bandwidth) | 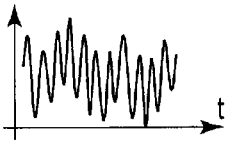<br>Switch 105 selects input terminal B<br>or<br><br>switch 105 selects input terminal C (constant envelope signal with phase not modulated) |
| Normal state | <br>Switch 106 selects input terminal A | 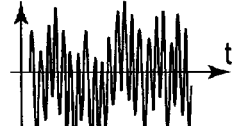<br>Switch 105 selects input terminal A |

FIG. 10

SIGNAL PROCESSING APPARATUS

CROSS-REFERENCE TO RELATED APPLICATIONS

This application is based upon and claims the benefit of priority from Japanese Patent Application No. 2014-038881, filed Feb. 28, 2014, the entire contents of which are incorporated herein by reference.

FIELD

Embodiments relate to a signal processing apparatus.

BACKGROUND

A power supply modulation type power amplifier (PA) receives two signals. The two signals are preferably synchronously input to the power amplifier. However, the signals pass through different signal paths and are subjected to different amounts of delay on the signal paths. Hence, to allow the two signals to be synchronously input to the power amplifier, the difference in delay between the signal paths needs to be corrected by delaying one or both of the signals.

Moreover, for various 2-input/1-output circuits including power supply modulation type power amplifiers, various characteristic differences between the signal paths of the two input signals may desirably be corrected.

BRIEF DESCRIPTION OF THE DRAWINGS

FIG. 4 is a diagram illustrating a method for estimating the amount of delay between a digital loopback signal and a second digital signal;

FIG. 5 is a diagram illustrating a method for estimating the amount of delay between a first digital signal and a digital loopback signal;

FIG. 6 is a diagram illustrating an input terminal selected by each of two switches in FIG. 1 and waveforms of an RF signal and an analog power supply voltage signal, for each operation state of the signal processing apparatus according to the first embodiment;

FIG. 7 is a block diagram depicting a variation of FIG. 1;

FIG. 8 is a diagram illustrating a switch provided in a signal processing apparatus according to a second embodiment;

FIG. 9 is a diagram illustrating a switch provided in the signal processing apparatus according to the second embodiment;

FIG. 10 is a diagram illustrating input terminals selected by the switch in FIG. 8 and the switch in FIG. 9 and waveforms of an RF signal and an analog power supply voltage signal, for each operation state of the signal processing apparatus according to the second embodiment;

DETAILED DESCRIPTION

Figure 1:
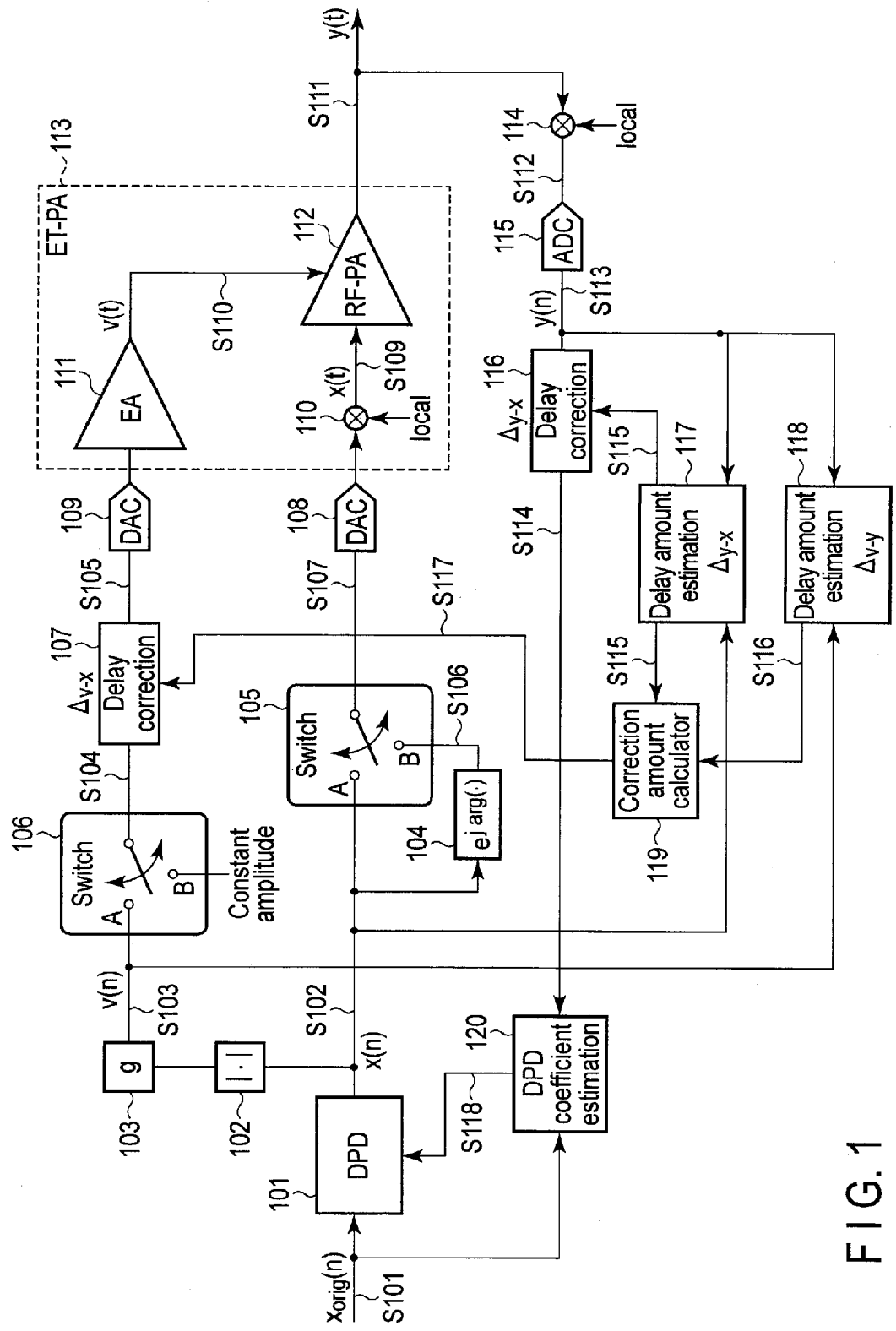
FIG. 1 is a block diagram illustrating a signal processing apparatus according to a first embodiment.

Embodiments will be described below with reference to the drawings.

According to an embodiment, a signal processing apparatus includes a first switch, a second switch, a corrector and a circuit. The first switch selects one signal from a first signal group including a first signal and a first constant envelope signal to obtain a first selected signal. The second switch selects one signal from a second signal group including a second signal and a second constant envelope signal to obtain a second selected signal. The corrector corrects a characteristic of at least one of the first and second selected signals to obtain a first corrected signal and a second corrected signal. The circuit generates an output signal from the first corrected signal and the second corrected signal.

Elements that are identical or similar to described elements are hereinafter denoted by identical or similar reference numerals, and duplicate descriptions are basically omitted. In the description below, a "signal" basically means an "electric signal".

First Embodiment

A signal processing apparatus according to a first embodiment corrects a delay difference between an RF (Radio Frequency) path and a power supply voltage path for an ET (Envelope Tracking)-PA that is a kind of power supply modulation type PA. The ET-PA may be replaced with another power supply modulation type PA such as an EER (Envelope Elimination and Restoration)-PA.

Specifically, as illustrated in FIG. 1, the signal processing apparatus includes a DPD (Digital Pre-Distorter) 101, an absolute value calculator 102, a linear transducer 103, a constant envelope modulator 104, a switch 105, a switch 106, a delay corrector 107, DAC (Digital-to-Analog Converter) 108, a DAC 109, an ET-PA 113, a mixer 114, an ADC (Analog-to-Digital Converter) 115, a delay corrector 116, a delay amount estimator 117, a delay amount estimator 118, a correction amount calculator 119, and a DPD coefficient estimator 120.

The DPD 101 receives an original signal S101 ($X_{orig}(n)$), and receives a signal indicative of a distortion compensation coefficient S118 from the DPD coefficient estimator 120. The original signal S101 is a complex signal intended for wireless communication. The DPD 101 uses the distortion compensation coefficient S118 to compensate for distortion of the original signal S101 to generate a baseband signal S102 ($x(n)$). The DPD 101 outputs a baseband signal S102 to the absolute value calculator 102, the constant envelope modulator 104, an input terminal A of the switch 105, and the delay amount estimator 117.

The absolute value calculator 102 receives the baseband signal S102 from the DPD 101. The absolute value calculator 102 calculates the absolute value $|x(n)|$ (that is, an amplitude component) of the baseband signal S102 which serves as a complex signal. The absolute value calculator 102 outputs a signal indicative of the absolute value $|x(n)|$ to the linear transducer 103.

The linear transducer 103 receives the signal indicative of the absolute value $|x(n)|$ from the absolute value calculator 102. The linear transducer 103 linearly converts the absolute value $|x(n)|$ into a digital power supply voltage signal S103 ($v(n)$) in accordance with Equation (1) illustrated below. A coefficient (a) and a coefficient (b) of Equation (1) are used to adjust the power supply voltage to a desired level. The linear transducer 103 outputs the digital power supply voltage signal S103 to an input terminal A of the switch 106 and the delay amount estimator 118.

$$v(n) = a|x(n)| + b \tag{1}$$

The constant envelope modulator 104 receives the baseband signal S102 from the DPD 101. The constant envelope modulator 104 performs constant envelope modulation on the baseband signal S102 to generate a constant envelope modulated signal S106. The constant envelope modulator 104 outputs the constant envelope modulated signal S106 to the input terminal B of the switch 105. The phase of the constant envelope modulated signal S106 depends on the phase of the baseband signal S102, but the amplitude of the constant envelope modulator 104 is constant.

The switch 105 receives the baseband signal S102 from the DPD 101 via the input terminal A, and receives the constant envelope modulated signal S106 from the constant envelope modulator 104 via the input terminal B. The switch 105 selects one of the input terminals A and B, for example, in accordance with a control signal not depicted in the drawings, to obtain a first digital signal (which may hereinafter also be referred to as a first selected signal) S107. In other words, the switch 105 selects one signal from a first signal group including the baseband signal S102 and the constant envelope modulated signal S106. The switch 105 outputs the first digital signal S107 to the DAC 108.

Specifically, the switch 105 selects the input terminal A (baseband signal S102) in a normal state (typically when a signal is transmitted) and when the amount of delay $\Delta_{y-x}$ described below is estimated. That is, the switch 105 outputs the baseband signal S102 serving as the first digital signal S107 to the DAC 108. Furthermore, the switch 105 selects the input terminal B (constant envelope modulated signal S106) when the amount of delay $\Delta_{y-y}$ described below is estimated. That is, the switch 105 outputs the constant envelope modulated signal S106 serving as the first digital signal S107 to the DAC 108.

The switch 106 receives the digital power supply voltage signal S103 via the input terminal A, and receives a constant amplitude signal (which may hereinafter also be referred to as a constant envelope signal) via an input terminal B. The switch 106 selects one of the input terminals A and B, for example, in accordance with a control signal not depicted in the drawings, to obtain a second digital signal (which may hereinafter also be referred to as a second selected signal) S104. In other words, the switch 106 selects one signal from a second signal group including the digital power supply voltage signal S103 and the constant amplitude signal. The switch 106 outputs the second digital signal S104 to the delay corrector 107.

Specifically, the switch 106 selects the input terminal A (digital power supply voltage signal S103) in the normal state and when the amount of delay $\Delta_{y-y}$ is estimated. That is, the switch 106 outputs the digital power supply voltage signal S103 serving as the second digital signal S104 to the delay corrector 107. Furthermore, the switch 106 selects the input terminal B (constant amplitude signal) when the amount of delay $\Delta_{y-x}$ is estimated. That is, the switch 106 outputs the constant amplitude signal serving as the second digital signal S104 to the delay corrector 107.

The delay corrector 107 receives the second digital signal S104 from the switch 106, and receives a signal indicative of the correction amount 117 ($\Delta_{y-x}$) from the correction amount calculator 119. The delay corrector 107 uses the correction amount S117 to correct the amount of delay of the second digital signal S104 to generate a corrected second digital signal S105. The correction amount S117 corresponds to an estimated value for a difference between the amount of delay between the first digital signal S107 and a digital loopback signal S113 described below and the amount of delay between the second digital signal S104 and the digital loopback signal S113. That is, the delay corrector 107 pre-compensates for the amount of delay of the second digital signal S104 to generate a corrected second digital signal S105. The amount of delay between the corrected second digital signal S105 and the digital loopback signal S113 is equal to the amount of delay between the first digital signal S107 and the digital loopback signal S113. The delay corrector 107 outputs the corrected second digital signal S105 to the DAC 109.

As described above, the delay corrector 107 corrects the amount of delay of the second digital signal S104 to make the amount of delay between the corrected second digital signal S105 and the digital loopback signal S113 equal to the amount of delay between the first digital signal S107 and the digital loopback signal S113. However, correcting the amount of delay of the first digital signal S107 rather than the second digital signal S104 allows the amount of delay between the corrected first digital signal and the digital loopback signal S113 to be made equal to the amount of delay between the second digital signal S104 and the digital loopback signal S113. Similarly, discrete correction of the amounts of delay of the first digital signal S107 and the second digital signal S104 allows the amount of delay between the corrected first digital signal and the digital loopback signal S113 to be made equal to the amount of delay between the corrected second digital signal and the digital loopback signal S113.

The DAC 108 receives the first digital signal S107 from the switch 105. The DAC 108 performs a digital-to-analog conversion on the first digital signal S107 into a first analog signal. The DAC 108 outputs the first analog signal to the first input terminal of the ET-PA 113.

The DAC 109 receives the corrected second digital signal S105 from the delay corrector 107. The DAC 109 performs a digital-to-analog conversion on the corrected second digital signal S105 into a second analog signal. The DAC 109 outputs the second analog signal to a second input terminal (which may hereinafter also be referred to as a power supply voltage control terminal).

The ET-PA 113 receives the first analog signal via the first input terminal and receives the second analog signal via the second input terminal. The ET-PA 113 upconverts the first analog signal into an RF signal S109 (x(t)), and amplifies the RF signal S109 into a transmission signal S111 (y(t)). A power supply voltage used to amplify the RF signal S109 depends on the second analog signal. The ET-PA 113 outputs the transmission signal S111 to an antenna not depicted in the drawings and a mixer 114.

Specifically, the ET-PA 113 includes a mixer 110, an EA (Envelope Amplifier) 111, and an RF-PA 112.

The mixer 110 receives a local signal and receives the first analog signal from the DAC 108 via the first input terminal of the ET-PA 113. The mixer 110 uses the local signal to upconvert the first analog signal (specifically, multiply the first analog signal by the local signal) into an RF signal S109. The mixer 110 outputs the RF signal S109 to a gate terminal of the RF-PA 112.

The EA 111 receives the second analog signal from the DAC 109 via the second input terminals of the ET-PA 113. The EA 111 amplifies the second analog signal into an analog supply voltage signal S110 (v(t)). The EA 111 outputs the analog supply voltage signal S110 to a drain terminal of the RF-PA 112.

The RF-PA 112 receives the RF signal S109 from the mixer 110 via the gate terminal, and receives the analog supply voltage signal S110 from the EA 111 via the drain terminal. The RF-PA 112 amplifies the RF signal S109 to generate a transmission signal S111. A power supply voltage for the RF-PA 112 depends on the analog supply voltage signal S110. The RF-PA 112 outputs the transmission signal S111 to the antenna not depicted in the drawings and the mixer 114. The antenna not depicted in the drawings radiates the transmission signal S111 as an electric wave to the atmosphere.

The mixer 114 receives the local signal and receives the transmission signal Sill from the ET-PA 113. The mixer 114 uses the local signal to downconvert the transmission signal S111 (specifically, multiply the transmission signal S111 by the local signal) to generate an analog loopback signal S112. The mixer 114 outputs the analog loopback signal S112 to the ADC 115.

The ADC 115 receives the analog loopback signal S112 from the mixer 114. The ADC 115 performs an analog-to-digital conversion on the analog loopback signal S112 to generate a digital loopback signal S113 (y(n)). The ADC 115 outputs the digital loopback signal S113 to the delay corrector 116, the delay amount estimator 117, and the delay amount estimator 118.

The delay corrector 116 receives the digital loopback signal S113 and receives a signal indicative of an estimated delay amount S115 ($\Delta_{y-x}$) from the delay amount estimator 117. The delay corrector 116 uses the estimated delay amount S115 to correct the amount of delay of the digital loopback signal S113 to generate a corrected loopback signal S114. The estimated delay amount S115 corresponds to an estimated value for the amount of delay of the digital loopback signal S113 with respect to the baseband signal S102. That is, the delay corrector 116 cancels the amount of delay of the digital loopback signal S113 with respect to the baseband signal S102 to generate a corrected loopback signal S114. The delay corrector 116 outputs the corrected loopback signal S114 to the DPD coefficient estimator 120.

The delay amount estimator 117 receives the baseband signal S102 and receives the digital loopback signal S113 from the ADC 115. The delay amount estimator 117 estimates the amount of delay of the digital loopback signal S113 with respect to the baseband signal S102 to obtain the estimated delay amount S115. The delay amount estimator 117 outputs the signal indicative of the estimated delay amount S115 to the delay corrector 116 and the correction amount calculator 119. The delay amount estimator 117 will be described below in detail.

The delay amount estimator 118 receives the digital power supply voltage signal S103 from the linear transducer 103, and receives the digital loopback signal S113 from the ADC 115. The delay amount estimator 118 estimates the amount of delay of the digital power supply voltage signal S103 with respect to the digital loopback signal S113 to obtain an estimated delay amount S116 ($\Delta_{v-y}$). The delay amount estimator 118 outputs a signal indicative of the estimated delay amount S116 to the correction amount calculator 119. The delay amount estimator 118 will be described below in detail.

The correction amount calculator 119 receives the signal indicative of the estimated delay amount S115 from the delay amount estimator 117, and receives the signal indicative of the estimated delay amount S116 from the delay amount estimator 118. Based on the estimated delay amount S115 and the estimated delay amount S116, the correction amount calculator 119 calculates the correction amount S117 corresponding to the difference between the amount of delay between the baseband signal S102 and the digital loopback signal S113 and the difference between the digital power supply voltage signal S103 and the digital loopback signal S113. Specifically, the correction amount calculator 119 can calculate the correction amount S117 by subtracting the estimated delay amount S115 from the estimated delay amount S116 in accordance with Equation (2) illustrated below. The correction amount calculator 119 outputs the signal indicative of the correction amount S117 to the delay corrector 107.

$$\Delta_{v-x} = \Delta_{v-y} - \Delta_{y-x} \qquad (2)$$

The DPD coefficient estimator 120 receives the original signal S101 and receives the corrected loopback signal S114 from the delay corrector 116. Based on the original signal S101 and the corrected loopback signal S114, the DPD coefficient estimator 120 estimates a distortion compensation coefficient S118. The DPD coefficient estimator 120 outputs the signal indicative of the distortion compensation coefficient S118 to the DPD 101.

As described above, the delay amount estimator 117 and the delay amount estimator 118 need to estimate the amount of delay between two signals. In general, the amount of delay between I/O signals in any signal path is estimated by searching for the number of samples that provides the maximum value of a cross correlation function for the I/O signals.

Figure 2:
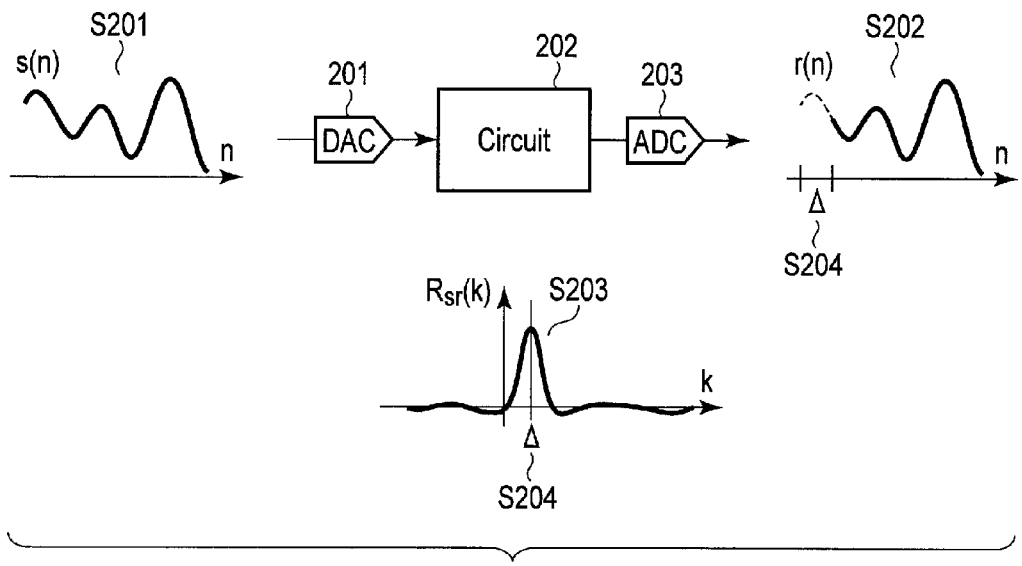
FIG. 2 is a diagram illustrating a technique for estimating the amount of delay between two signals.

For example, it is assumed that a delay amount S204 (A) is present between an input digital signal S201 (s(n)) and an output digital signal S202 (r(n)) in a signal path including a signal path depicted in FIG. 2 and including a DAC 201, a circuit 202, and an ADC 203. The output digital signal S202 is generated by applying, to the input digital signal S201, a digital-to-analog conversion performed by the DAC 201, an analog signal process performed by the circuit 202, and an analog-to-digital conversion performed by the ADC 203. The delay amount S204 can be estimated using a cross correlation function $R_{sr}(k)$ (S203) in:

$$R_{sr}(k) = \sum_{n=1}^{N} s(n) r^*(n+k) \qquad (3)$$

In Equation (3), a sample length used to calculate the cross correlation function S203 is denoted by N. Complex conjugate is meant by *. The cross correlation function $R_{sr}(k)$ takes the maximum value at $k=\Delta$. Thus, the delay amount S204 is estimated by searching for the number of samples k providing the maximum value of the cross correlation function $R_{sr}(k)$.

A technique for estimating the amount of delay between two signals is not limited to the above-described example. For example, FFT (Fast Fourier Transform) may be applied to each of the two signals, and division may be performed on each frequency component of each of the resultant signals. Then, the amount of delay may be estimated based on the slopes of phase components of quotient spectra. The delay amount estimator 117 and the delay amount estimator 118 can estimate the amount of delay between the two signals in accordance with any technique. However, in the description below, the amount of delay between the two signals is estimated using the cross correlation function for simplification.

Figure 3:
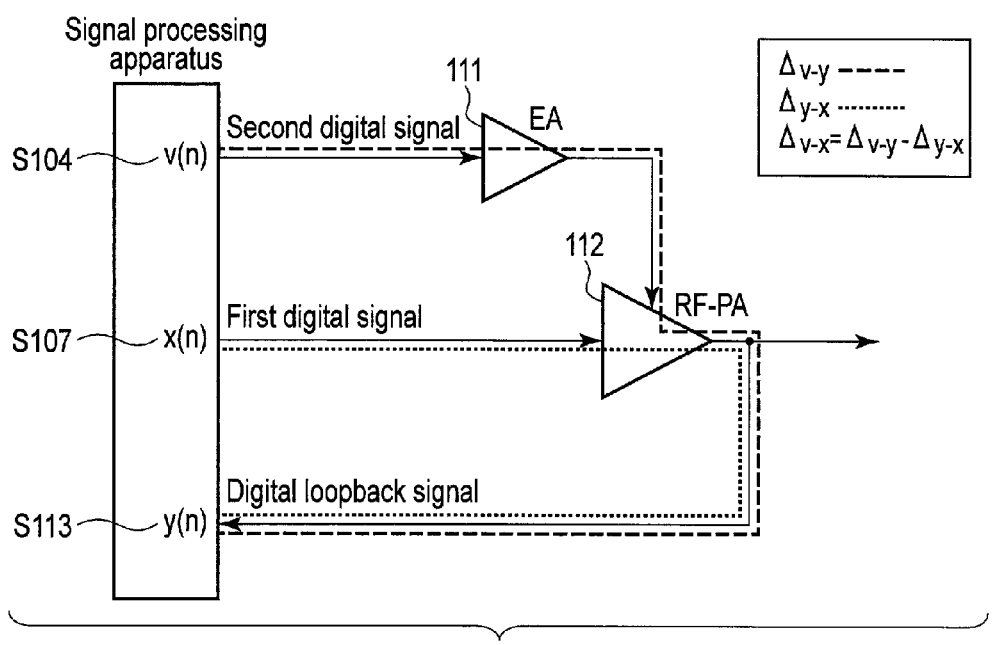
FIG. 3 is a diagram illustrating the amount of delay estimated by two delay amount estimators in FIG. 1.

The delay amount estimator 117 estimates the amount of delay between the first digital signal S107 and the digital loopback signal S113 which correspond to I/O signals in a signal path depicted by a dotted line in FIG. 3. Similarly, the delay amount estimator 118 estimates the amount of delay between the second digital signal S104 and the digital loopback signal S113 which correspond to I/O signals in a signal path depicted by a dashed line in FIG. 3. However, the digital loopback signal S113 depends both on the first digital signal S107 and on the second digital signal S104, making accurate estimation of the amounts of delay difficult.

Specifically, the adverse effect of the digital power supply voltage signal S103 (v(n)) (for example, a variation in AM/PM characteristics caused by modulation of the power supply voltage of the RF-PA 112) may make the waveform of the digital loopback signal S113 (y(n)) significantly different from a waveform resulting from application of a delay to the waveform of the baseband signal S102 (x(n)). In such a case, when the number of samples is searched for which provides the maximum value of the cross correlation function for the digital loopback signal S113 (y(n)) and the baseband signal S102 (x(n)) serving as the first digital signal S107, the resultant number of samples may be different from the amount of delay between the digital loopback signal S113 (y(n)) and the first digital signal S107.

Thus, in estimating a first amount of delay between a first input signal in a first signal path and an output signal, the signal processing apparatus according to the present embodiment alleviates the adverse effect, on the output signal, of a second input signal in a second signal path overlapping the first signal path. Similarly, in estimating a second amount of delay between the second input signal in the second signal path and the output signal, the signal processing apparatus according to the present embodiment alleviates the adverse effect, on the output signal, of the first input signal in the first signal path.

Specifically, the switch 105 and the switch 106 operate as illustrated in FIG. 6 to allow the delay amount estimator 117 and the delay amount estimator 118 to accurately estimate the amount of delay.

For example, when the delay amount estimator 117 estimates the amount of delay between the first digital signal S107 and the digital loopback signal S113, the switch 106 selects the input terminal B in order to alleviate the adverse effect of the second digital signal S104 on the digital loopback signal S113. At this time, as depicted in FIG. 5, the constant amplitude signal is output as the second digital signal S104. The adverse effect of the digital loopback signal S113 with a constant amplitude is less significant than the adverse effect of the digital power supply voltage signal S103 with an inconstant amplitude. Hence, the delay amount estimator 117 can accurately estimate the amount of delay of the digital loopback signal S113 (y(n)) with respect to the first digital signal S107 (which corresponds to the baseband signal S102 (x(n))) by searching for the number of samples providing the maximum value of the cross correlation function in:

$$R_{xy}(k) = \sum_{n=1}^{N} x(n)y^*(n+k) \quad (4)$$

Similarly, when the delay amount estimator 118 estimates the amount of delay between the second digital signal S104 and the digital loopback signal S113, the switch 105 selects the input terminal B in order to alleviate the adverse effect of the first digital signal S107 on the digital loopback signal S113. At this time, as depicted in FIG. 4, the constant envelope modulated signal S106 is output as the first digital signal S107. The adverse effect of the constant envelope modulated signal on the digital loopback signal S113 is less significant than the adverse effect of the baseband signal S102 with an inconstant amplitude. Hence, the delay amount estimator 118 can accurately estimate the amount of delay of the second digital signal S104 (which corresponds to the digital power supply voltage signal S103 (v(n))) with respect to the digital loopback signal S113 (y(n)) by searching for the number of samples providing the maximum value of the cross correlation function in:

$$R_{yv}(k) = \sum_{n=1}^{N} |y(n)|v(n+k) \quad (5)$$

The digital power supply voltage signal S103 is a real part signal, and thus affects amplitude components of the digital loopback signal S113 but does not affect phase components of the digital loopback signal S113. Thus, instead of y(n), the absolute value of y(n) is used in Equation (5).

After the delay amount estimator 117 and the delay amount estimator 118 estimate the amounts of delay, the signal processing apparatus in FIG. 1 starts a normal operation. In the normal state, the switch 105 selects the input terminal A, and the switch 106 selects the input terminal A, as illustrated in FIG. 6. Thus, the switch 105 outputs the baseband signal S102 serving as the first digital signal S107 to the DAC 108. The switch 106 outputs the digital power supply voltage signal S103 serving as the second digital signal S104 to the delay corrector 107. That is, the baseband signal S102 (x(n)) and the digital power supply voltage signal S103 (v(n)) are used as two signals input to the ET-PA 113 in the normal state.

As described above, in estimating the first amount of delay between the first input signal in the first signal path and the output signal, the signal processing apparatus according to the first embodiment selects the constant envelope signal as the second input signal in the second signal path overlapping the first signal path. Similarly, in estimating the second amount of delay between the second input signal in the second signal path and the output signal, the signal processing apparatus selects the constant envelope signal as the first input signal in the first signal path. Thus, in estimating the amount of delay between one of the input signals and the output signal, the signal processing apparatus alleviates the adverse effect of the other input signal on the output signal to allow the amount of delay to be accurately estimated.

The signal processing apparatus in FIG. 1 estimates the amount of delay using the digital loopback signal S113 obtained by looping back the transmission signal S111. However, such a loopback mechanism may be omitted from the signal processing apparatus according to the present embodiment. The omission of the loopback mechanism enables a reduction in circuit scale.

Specifically, as illustrated in FIG. 7, a receiver 131 receiving the transmission signal Sill from a transmitter 130 including the signal processing apparatus according to the first embodiment may estimate the delay amount S115 and the delay amount S116.

The transmitter 130 includes the absolute value calculator 102, the linear transducer 103, the constant envelope modulator 104, the switch 105, the switch 106, the delay corrector 107, the DAC 108, the DAC 109, and the ET-PA 113. In FIG. 7, the DPD 101, the delay corrector 116, and the DPD coefficient estimator 120 are omitted for simplification, but may be added. A transmission signal S111 radiated from an antenna (not depicted in the drawings) of the transmitter 130 is transmitted to a receiver 131 via a wireless channel.

The receiver 131 includes the mixer 114, the ADC 115, the delay corrector 116, the delay amount estimator 117, the delay amount estimator 118, and the correction amount calculator 119.

The mixer 114 receives the local signal and receives an RF signal as a reception signal of the transmission signal S111, from an analog processing circuit not depicted in the drawings. The mixer 114 uses the local signal to downconvert the RF signal (specifically, multiply the RF signal by the local signal) to generate an analog baseband signal S112. The mixer 114 outputs the analog baseband signal S112 to the ADC 115.

The ADC 115 receives the analog baseband signal S112 from the mixer 114. The ADC 115 performs an analog-to-digital conversion on the analog baseband signal S112 to generate a digital baseband signal S113 (y(n)). The ADC 115 outputs the digital baseband signal S113 to the delay amount estimator 117, the delay amount estimator 118, and a data demodulator not depicted in the drawings.

The delay amount estimator 117 receives a training sequence S130 (x'(n)) that is identical to the baseband signal S102, and receives the digital baseband signal S113 from the ADC 115. The delay amount estimator 117 estimates the amount of delay of the digital loopback signal S113 with respect to the training sequence S130 to obtain the estimated delay amount S115. The delay amount estimator 117 outputs the signal indicative of the estimated delay amount S115 to the delay corrector 116 and the correction amount calculator 119.

The delay amount estimator 118 receives the training sequence S131 (v'(n)) that is identical to the digital power supply voltage signal S103, and receives the digital baseband signal S113 from the ADC 115. The delay amount estimator 118 estimates the amount of delay of the training sequence S131 with respect to the digital baseband signal S113 to obtain the estimated delay amount S116. The delay amount estimator 118 outputs the signal indicative of the estimated delay amount S115 to the correction amount calculator 119.

The correction amount calculator 119 receives the signal indicative of the estimated delay amount S115 from the delay amount estimator 117, and receives the signal indicative of the estimated delay amount S116 from the delay amount estimator 118. The correction amount calculator 119 calculates the correction amount S117 based on the estimated delay amount S115 and the estimated delay amount S116. Specifically, the correction amount calculator 119 can calculate the correction amount S117 by subtracting the estimated delay amount S115 from the estimated delay amount S116 in accordance with Equation (2) illustrated above. The signal indicative of the correction amount S117 is transmitted to the delay corrector 107 via the wireless channel.

Second Embodiment

A signal processing apparatus according to a second embodiment is different from the signal processing apparatus according to the first embodiment in one or both of the switches described in the first embodiment. Specifically, the signal processing apparatus according to the second embodiment may include a switch 106 illustrated in FIG. 8 instead of the switch 106 depicted in FIG. 1 and FIG. 7. Furthermore, the signal processing apparatus according to the second embodiment may include a switch 105 illustrated in FIG. 9 instead of the switch 105 depicted in FIG. 1 and FIG. 7.

The switch 106 in FIG. 8 includes an input terminal C in addition to the input terminal A and the input terminal B. The switch 106 receives a Gaussian noise signal via the input terminal C. The Gaussian noise signal has a larger bandwidth than a digital power supply voltage signal S103. Instead of the Gaussian noise signal, any type of pseudo noise signal may be input via the input terminal C.

The switch 106 obtains a second digital signal S104 by selecting one of the input terminals A, B, and C in accordance with a control signal not depicted in the drawings. In other words, the switch 106 selects one signal from a second signal group including the digital power supply voltage signal S103, a constant amplitude signal, and the Gaussian noise signal. The switch 106 outputs the second digital signal S104 to a delay corrector 107.

Specifically, as illustrated in FIG. 10, the switch 106 selects the input terminal A (digital power supply voltage signal S103) in the normal state. That is, the switch 106 outputs the digital power supply voltage signal S103 serving as the second digital signal S104 to the delay corrector 107. Furthermore, the switch 106 selects the input terminal B (constant amplitude signal) when the amount of delay $\Delta_{y-x}$ is estimated. That is, the switch 106 outputs a constant amplitude signal serving as the second digital signal S104 to the delay corrector 107.

The switch 106 may select the input terminal C (Gaussian noise signal) instead of the input terminal A when the amount of delay $\Delta_{v-y}$ is estimated. That is, the switch 106 can output the Gaussian noise signal serving as the second digital signal S104 to the delay corrector 107. When the input terminal C is selected, the Gaussian noise signal having a larger bandwidth than the digital power supply voltage signal S103 is used as a second input signal to an ET-PA 113. This enables the amount of delay $\Delta_{v-y}$ to be estimated using a resolution finer than the resolution used when the input terminal A is selected.

The switch 105 in FIG. 9 includes the input terminal C in addition to the input terminal A and the input terminal B. The switch 105 receives a constant amplitude signal via the input terminal C. The constant amplitude signal is different from a constant envelope modulated signal S106 in that the phase of the constant amplitude signal does not depend on the baseband signal S102. The input terminal B and an associated constant envelope modulator 104 may be omitted.

The switch 105 selects one of the input terminals A, B, and C in accordance with a control signal not depicted in the drawings to obtain a first digital signal S107. In other words, the switch 105 selects one signal from a first signal group including a baseband signal S102, the constant envelope modulated signal S106, and the constant amplitude signal. The switch 105 outputs the first digital signal S107 to a DAC 108.

Specifically, as illustrated in FIG. 10, the switch 105 selects the input terminal A (baseband signal S102) in the normal state and when the amount of delay $\Delta_{y-x}$ is estimated. That is, the switch 105 outputs the baseband signal S102 serving as the first digital signal S107 to the DAC 108. Furthermore, the switch 105 may select the input terminal C (constant amplitude signal) instead of the input terminal B (constant envelope modulated signal S106) when the amount of delay $\Delta_{v-y}$ is estimated. That is, the switch 105 can output the constant amplitude signal serving as the first digital signal S107 to the DAC 108. When the input terminal C is selected, the constant amplitude signal with a phase independent of the baseband signal S102 is used as a first input signal to an ET-PA 113. Thus, the amount of delay $\Delta_{v-y}$ can be estimated more accurately than when the input terminal B is selected.

As described above, in estimating the second amount of delay between the second input signal in the second signal path and the output signal, the signal processing apparatus according to the present embodiment selects the pseudo noise signal having a larger bandwidth than the second input signal in the normal state. Thus, the signal processing apparatus allows the second amount of delay to be estimated with a finer resolution. Moreover, in estimating the second amount of delay, the signal processing apparatus selects, as the first input signal in the first signal path overlapping the second signal path, the constant amplitude signal having a phase independent of the first input signal in the normal state. Therefore, the signal processing apparatus can accurately estimate the second amount of delay.

When the ET-PA 113 is generalized as a 2-input/1-output circuit, both the switch 105 and the switch 106 may be modified as illustrated in FIG. 8, or both the switch 105 and the switch 106 may be modified as illustrated in FIG. 9.

Third Embodiment

The first embodiment and the second embodiment are applicable to various 2-input/1-output circuits without limitation to power supply modulation type PAs. For example, as depicted in FIG. 11, a signal processing apparatus according to a third embodiment may be applied to LINC (LInear amplification using Nonlinear Components) PAs.

Figure 11:
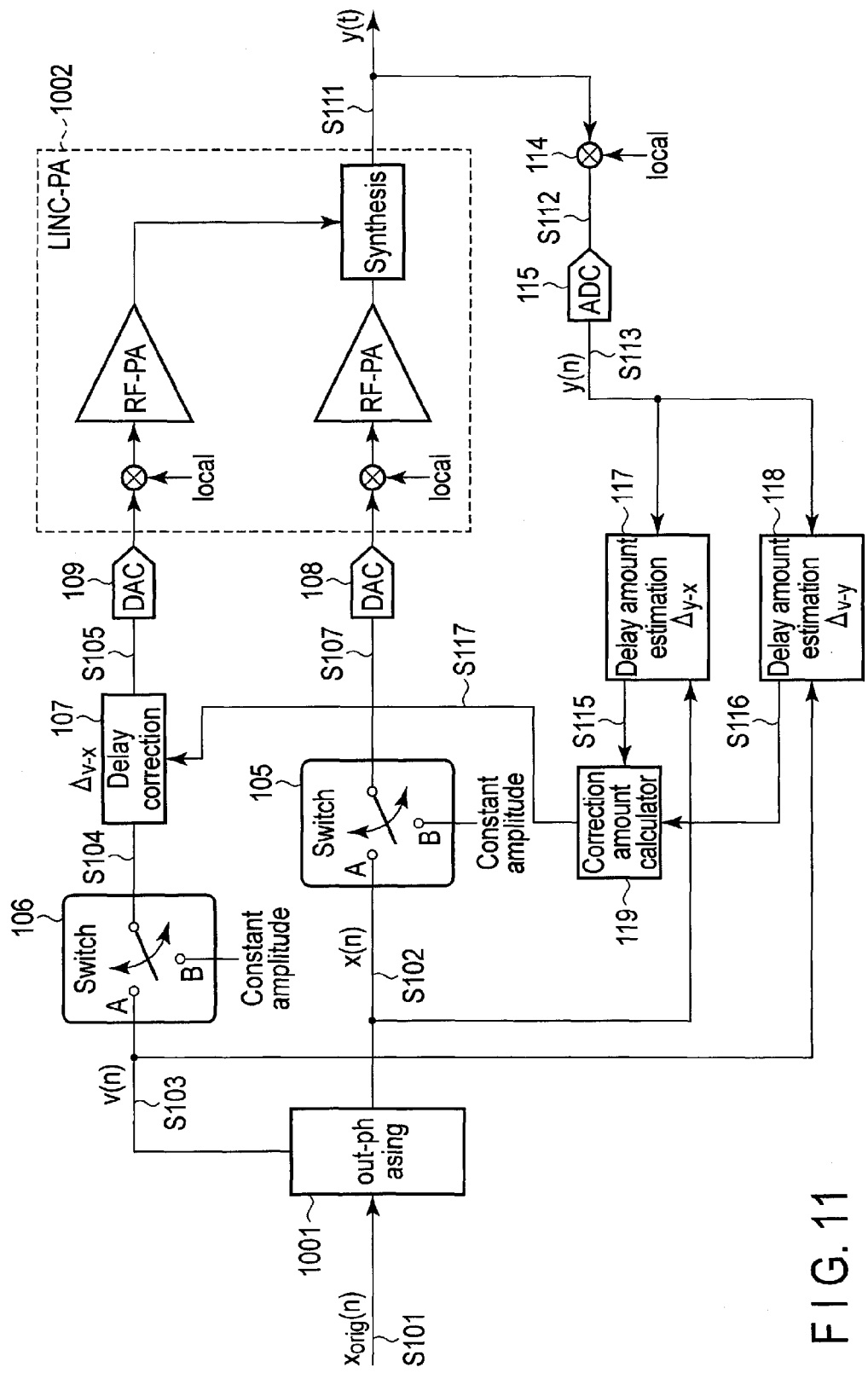
FIG. 11 is a block diagram illustrating a signal processing apparatus according to a third embodiment.

Specifically, the signal processing apparatus illustrated in FIG. 11 includes an out-phasing processor 1001, a switch 105, a switch 106, a delay corrector 107, a DAC 108, a DAC 109, a LINC-PA 1002, a mixer 114, an ADC 115, a delay amount estimator 117, a delay amount estimator 118, and a correction amount calculator 119. In FIG. 11, the signal processing apparatus does not include a DPD 101, a delay corrector 116, or a DPD coefficient estimator 120 for simplification but may additionally include these components.

The out-phasing processor 1001 receives an original signal S101 ($x_{orig}(n)$). The out-phasing processor 1001 performs an out-phasing process on the original signal S101 in accordance with Equation (6) illustrated below to generate a first digital phase signal S102 ($x(n)$) and a second digital phase signal S103 ($v(n)$).

$$x(n) = A\exp\{j(\phi+\theta)\}$$

$$v(n) = A\exp\{j(\phi-\theta)\} \quad (6)$$

In Equation (6), the maximum amplitude of $x_{orig}(n)$ is denoted by A, $\phi$ is equal to $\arg x_{orig}(n)$, and $\theta$ is equal to arc cos $\{|x_{orig}(n)|/(2A)\}$. The out-phasing processor 1001 outputs the first digital phase signal S102 to an input terminal A of the switch 105, and outputs the second digital phase signal S103 to an input terminal A of the switch 106.

The switch 105 receives the first digital phase signal S102 from the out-phasing processor 1001 via the input terminal A, and receives a constant amplitude signal via an input terminal B. The switch 105 selects one of the input terminals A and B in accordance with a control signal not depicted in the drawings to obtain a first digital signal S107. In other words, the switch 105 selects one signal from a first signal group including the first digital phase signal S102 and the constant amplitude signal. The switch 105 outputs the first digital signal S107 to the DAC 108.

Specifically, the switch 105 selects the input terminal A (first digital phase signal S102) in the normal state and when the amount of delay $\Delta_{y-x}$ described below is estimated. That is, the switch 105 outputs the first digital phase signal S102 serving as the first digital signal S107 to the DAC 108. Furthermore, the switch 105 selects the input terminal B (constant amplitude signal) when the amount of delay $\Delta_{v-y}$ described below is estimated. That is, the switch 105 outputs the constant amplitude signal serving as the first digital signal S107 to the DAC 108.

The switch 106 receives the second digital power supply voltage signal S103 from the out-phasing processor 1001 via the input terminal A, and receives the constant amplitude signal via the input terminal B. The switch 106 selects one of the input terminals A and B, for example, in accordance with a control signal not depicted in the drawings to obtain a second digital signal S104. In other words, the switch 106 selects one signal from a second signal group including the second digital phase signal S103 and the constant amplitude signal. The switch 106 outputs the second digital signal S104 to the delay corrector 107.

Specifically, the switch 106 selects the input terminal A (second digital phase signal S103) in the normal state and when the amount of delay $\Delta_{v-y}$ is estimated. That is, the switch 106 outputs the second digital phase signal S103 serving as the second digital signal S104 to the delay corrector 107. Furthermore, the switch 106 selects the input terminal B (constant amplitude signal) when the amount of delay $\Delta_{y-x}$ is estimated. That is, the switch 106 outputs the constant amplitude signal serving as the second digital signal S104 to the delay corrector 107.

The switch 105 may be modified as illustrated in FIG. 8 or FIG. 9. Similarly, the switch 106 may be modified as illustrated in FIG. 8 or FIG. 9.

The LINC-PA 1002 receives a first analog signal from the DAC 108 via a first input terminal, and receives a second analog signal from the DAC 109 via a second input terminal. The LINC-PA 1002 upconverts the first analog signal to generate a first RF signal, and amplifies the first RF signal to generate a first amplified signal. Similarly, the LINC-PA 1002 upconverts the second analog signal into a second RF signal, and amplifies the second RF signal into a second amplified signal. The LINC-PA 1002 synthesizes the first amplified signal and the second amplified signal to generate a transmission signal S111 ($y(t)$).

The LINC-PA 1002 may be replaced with any 2-input/1-output circuit. For example, the LINC-PA 1002 may be replaced with a load modulation type PA. A digital Doherty PA, which is a type of load modulation type PA, uses a signal for a carrier amplifier and a signal for a peak amplifier as two input signals. The signal for the carrier amplifier corresponds to the original signal S101 (or the original signal S101 on which any signal processing (for example, distortion compensation) has been performed). The signal for the peak amplifier corresponds to a signal obtained by applying a given delay to the original signal S101.

Alternatively, the LINC-PA 1002 may be replaced with a quadrature demodulator. The quadrature demodulator uses an in-phase component (real component) and a quadrature component (imaginary component) of the original signal S101 as two input signals.

As described above, in the signal processing apparatus according to the third embodiment, the power modulation type PA in the signal processing apparatus according to the first embodiment or the second embodiment is replaced with any type of 2-input/1-output circuit such as the LINC-PA, the load modulation type PA, or the quadrature demodulator. Thus, the signal processing apparatus allows accurate estimation of the amount of delay between each of two input signals and an output signal in any type of 2-input/1-output circuit.

Fourth Embodiment

Figure 12:
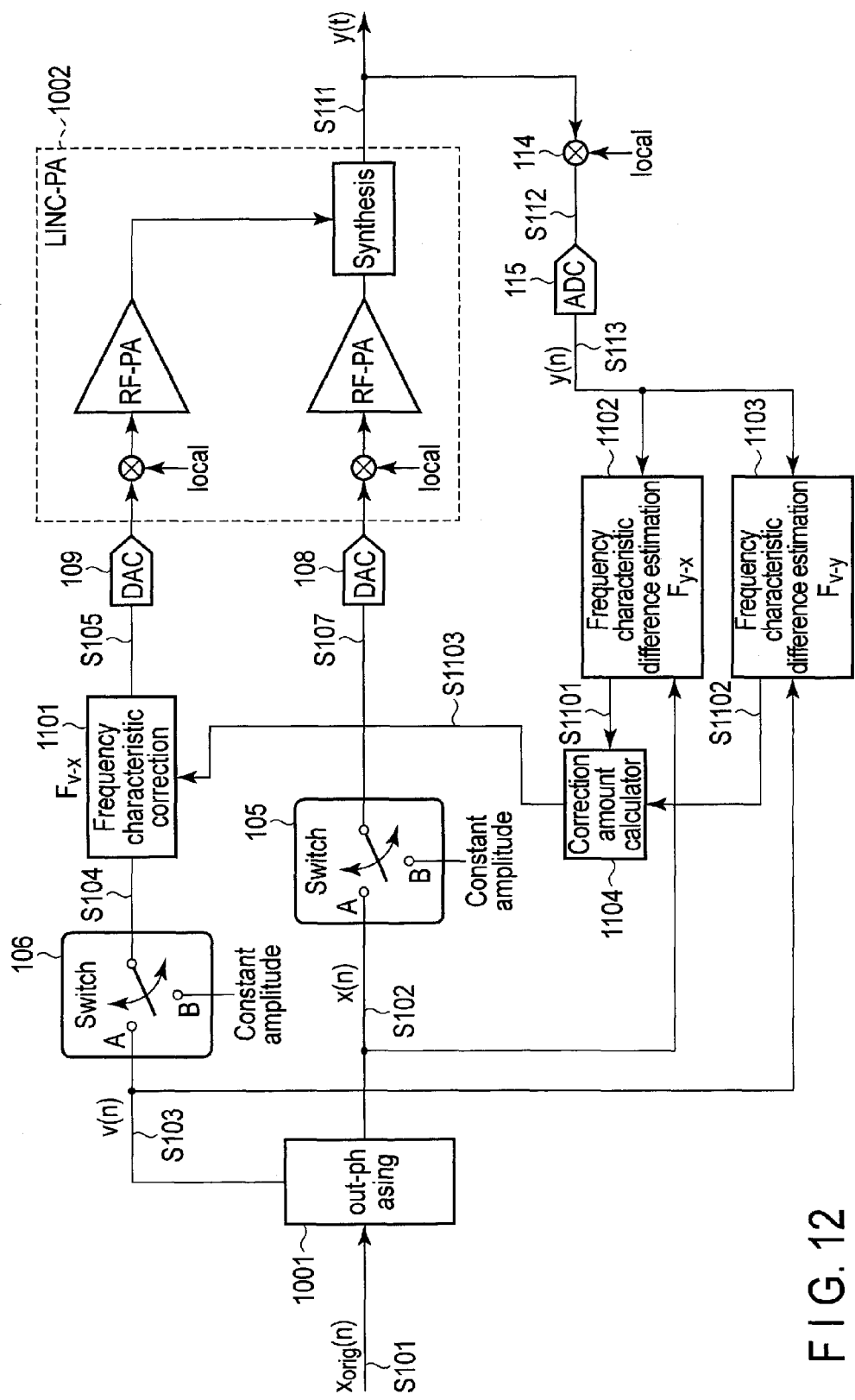
FIG. 12 is a block diagram illustrating a signal processing apparatus according to a fourth embodiment.

The first embodiment, the second embodiment, and the third embodiment may be used to estimate a characteristic difference not limited to the amount of delay, between I/O signals in a signal path for any type of 2-input/1-output circuit. For example, as depicted in FIG. 12, the signal processing apparatus according to a fourth embodiment may be used to estimate a frequency characteristic. Although not depicted in the drawings, the signal processing apparatus may be used to estimate a gain characteristic difference. Moreover, the signal processing apparatus according to the fourth embodiment may be used to estimate any two or more of various characteristic differences such as the amount of delay, the frequency characteristic difference, and the gain characteristic difference.

Specifically, the signal processing apparatus illustrated in FIG. 12 includes an out-phasing processor 1001, a switch 105, a switch 106, a frequency characteristic corrector 1101, a DAC 108, a DAC 109, a LINC-PA 1002, a mixer 114, an ADC 115, a frequency characteristic estimator 1102, a frequency characteristic estimator 1103, and a correction amount calculator 1104. In FIG. 12, the signal processing apparatus does not include a DPD 101, a delay corrector 116, or a DPD coefficient estimator 120 for simplification but may additionally include these components. Furthermore, as described in the third embodiment, the LINC-PA 1002 may be replaced with any type of 2-input/1-output circuit.

The frequency characteristic corrector 1101 receives a second digital signal S104 from the switch 106 and receives a signal indicative of a correction amount S1103 ($F_{y\text{-}x}$) from the correction amount calculator 1104. The frequency characteristic corrector 1101 corrects the frequency characteristic of the second digital signal S104 based on the correction amount S1103 to generate a corrected second digital signal S105. The correction amount S1103 corresponds to an estimated value for a difference between a frequency characteristic difference between a first digital signal S107 and a digital loopback signal S113 and a frequency characteristic difference between the second digital signal S104 and the digital loopback signal S113. That is, the frequency characteristic corrector 1101 pre-compensates for the frequency characteristic of the second digital signal S104 to generate a corrected second digital signal S105. The frequency characteristic difference between the corrected second digital signal S105 and the digital loopback signal S113 is equal to the frequency characteristic difference between the first digital signal S107 and the digital loopback signal S113. The frequency characteristic corrector 1101 outputs the corrected second digital signal S105 to the DAC 109.

As described above, the frequency characteristic corrector 1101 corrects the second digital signal S104 to make the frequency characteristic difference between the corrected second digital signal S105 and the digital loopback signal S113 equal to the frequency characteristic difference between the first digital signal S107 and the digital loopback signal S113. However, instead of the frequency characteristic of the second digital signal S104, the frequency characteristic of the first digital signal S107 may be corrected to make the frequency characteristic difference between the corrected first digital signal and the digital loopback signal S113 equal to the frequency characteristic difference between the second digital signal S104 and the digital loopback signal S113. Similarly, the frequency characteristics of the first digital signal S107 and the second digital signal S104 may be discretely corrected to make the frequency characteristic difference between the corrected first digital signal and the digital loopback signal S113 equal to the frequency characteristic difference between the corrected second digital signal and the digital loopback signal S113.

The frequency characteristic estimator 1102 receives a first digital phase signal S102 and receives the digital loopback signal S113 from the ADC 115. The frequency characteristic estimator 1102 estimates the difference, in frequency characteristic, of the digital loopback signal S113 from the first digital phase signal S102 to obtain an estimated frequency characteristic difference S1101. The frequency characteristic estimator 1102 outputs a signal indicative of the estimated frequency characteristic difference S1101 to the correction amount calculator 1104.

The frequency characteristic corrector 1103 receives a second digital phase signal S103 from the out-phasing processor 1001 and receives the digital loopback signal S113 from the ADC 115. The frequency characteristic estimator 1103 estimates the difference, in frequency characteristic, of the digital loopback signal S113 from the second digital phase signal S103 to obtain an estimated frequency characteristic difference S1102 ($F_{v\text{-}y}$). The frequency characteristic estimator 1103 outputs a signal indicative of the estimated frequency characteristic difference S1102 to the correction amount calculator 1104.

The correction amount calculator 1104 receives the signal indicative of the estimated frequency characteristic difference S1101 from the frequency characteristic estimator 1102, and receives the signal indicative of the estimated frequency characteristic difference S1102 from the frequency characteristic estimator 1103. Based on the estimated frequency characteristic difference S1101 and the estimated frequency characteristic difference S1102, the correction amount calculator 1104 calculates the correction amount S1103 corresponding to the difference between the frequency characteristic difference between the first digital phase signal S102 and the digital loopback signal S113 and the frequency characteristic difference between the second digital phase signal S103 and the digital loopback signal S113. The correction amount calculator 1104 outputs the signal indicative of the correction amount S1103 to the frequency characteristic corrector 1101.

The switch 105 receives the first digital phase signal S102 from the out-phasing processor 1001 via an input terminal A, and receives a constant amplitude signal via an input terminal B. The switch 105 selects one of the input terminals A and B in accordance with a control signal not depicted in the drawings to obtain a first digital signal S107. In other words, the switch 105 selects one signal from a first signal group including the first digital phase signal S102 and the constant amplitude signal. The switch 105 outputs the first digital signal S107 to the DAC 108.

Specifically, the switch 105 selects the input terminal A (first digital phase signal S102) in the normal state and when the frequency characteristic difference $F_{y\text{-}x}$ is estimated. That is, the switch 105 outputs the first digital phase signal S102 serving as the first digital signal S107 to the DAC 108. Furthermore, the switch 105 selects the input terminal B (constant amplitude signal) when the frequency characteristic difference $F_{v\text{-}y}$ is estimated. That is, the switch 105 outputs the constant amplitude signal serving as the first digital signal S107 to the DAC 108.

The switch 106 receives the second digital phase signal S103 from the out-phasing processor 1001 via an input terminal A, and receives the constant amplitude signal via an input terminal B. The switch 106 selects one of the input terminals A and B, for example, in accordance with a control signal not depicted in the drawings to obtain a second digital signal S104. In other words, the switch 106 selects one signal from a second signal group including the second digital phase signal S103 and the constant amplitude signal. The switch 106 outputs the second digital signal S104 to the frequency characteristic corrector 1101.

Specifically, the switch 106 selects the input terminal A (second digital phase signal S103) in the normal state and when the frequency characteristic difference $F_{v\text{-}y}$ is estimated. That is, the switch 106 outputs the second digital phase signal S103 serving as the second digital signal S104 to the frequency characteristic corrector 1101. Furthermore, the switch 106 selects the input terminal B (constant amplitude signal) when the frequency characteristic difference $F_{y\text{-}x}$ is estimated. That is, the switch 106 outputs the constant amplitude signal serving as the second digital signal S104 to the frequency characteristic corrector 1101.

The switch 105 may be modified as illustrated in FIG. 8 or FIG. 9. Similarly, the switch 106 may be modified as illustrated in FIG. 8 or FIG. 9.

As described above, in the signal processing apparatus according to the fourth embodiment, the amount of delay estimated by the signal processing apparatus according to the first embodiment, the second embodiment, or the third embodiment is replaced with any type of characteristic difference between I/O signals in a signal path such as the frequency characteristic difference or the gain characteristic difference. Thus, the signal processing apparatus allows accurate estimation of any type of characteristic difference between each of two input signals and an output signal in any type of 2-input/i-output circuit.

At least a part of the processing in the above-described embodiments can be implemented using a general-purpose computer as basic hardware. A program implementing the processing in each of the above-described embodiments may be stored in a computer readable storage medium for provision. The program is stored in the storage medium as a file in an installable or executable format. The storage medium is a magnetic disk, an optical disc (CD-ROM, CD-R, DVD, or the like), a magnetooptic disc (MO or the like), a semiconductor memory, or the like. That is, the storage medium may be in any format provided that a program can be stored in the storage medium and that a computer can read the program from the storage medium. Furthermore, the program implementing the processing in each of the above-described embodiments may be stored on a computer (server) connected to a network such as the Internet so as to be downloaded into a computer (client) via the network.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A signal processing apparatus comprising:
a first switch that selects one signal from a first signal group including a first signal and a first constant envelope signal to obtain a first selected signal;
a second switch that selects one signal from a second signal group including a second signal, a second constant envelope signal, and a pseudo noise signal with a larger bandwidth than the second signal, to obtain a second selected signal;
a corrector that corrects a characteristic of at least one of the first and second selected signals to obtain a first corrected signal and a second corrected signal;
a circuit that generates an output signal from the first corrected signal and the second corrected signal;
a first estimator that estimates a first characteristic difference between the first selected signal and the output signal when the second switch selects the second constant envelope signal;
a second estimator that estimates a second characteristic difference between the second selected signal and the output signal when the first switch and the second switch select the first constant envelope signal and the pseudo noise signal, respectively; and
a calculator that calculates a correction amount for the characteristic of at least one of the first and second selected signals based on the first characteristic difference and the second characteristic difference,
wherein the corrector uses the correction amount to correct the characteristic of at least one of the first and second selected signals.

2. The apparatus according to claim 1, wherein:
the first characteristic difference is an amount of delay between the first selected signal and the output signal, and
the second characteristic difference is an amount of delay between the second selected signal and the output signal.

3. The apparatus according to claim 1, wherein:
the first characteristic difference is a frequency characteristic difference between the first selected signal and the output signal, and
the second characteristic difference is a frequency characteristic difference between the second selected signal and the output signal.

4. The apparatus according to claim 1, wherein:
the first characteristic difference is a gain characteristic difference between the first selected signal and the output signal, and
the second characteristic difference is a gain characteristic difference between the second selected signal and the output signal.

5. The apparatus according to claim 1, wherein the first signal and the second signal are based on a common signal.

6. The apparatus according to claim 5, wherein:
the circuit is a power supply modulation type power amplifier,
the first signal is a baseband signal based on the common signal, and
the second signal is a digital power supply voltage signal based on the common signal.

7. The apparatus according to claim 5, wherein:
the circuit is a LINC (Linear amplification using Nonlinear Components) power amplifier,
the first signal is a first digital phase signal resulting from an out-phasing process performed on the common signal, and
the second signal is a second digital phase signal resulting from the out-phasing process performed on the common signal.

8. The apparatus according to claim 5, wherein:
the circuit is a load modulation type power amplifier including a carrier amplifier and a peak amplifier,
the first signal is a signal for the carrier amplifier based on the common signal, and
the second signal is a signal for the peak amplifier based on the common signal.

9. The apparatus according to claim 5, wherein:
the circuit is a quadrature demodulator,
the first signal is an in-phase component signal based on the common signal, and
the second signal is a quadrature component signal based on the common signal.

10. A signal processing apparatus that generates a first input signal and a second input signal for a circuit that generates an output signal from the first input signal and the second input signal, the apparatus comprising:

a first switch that selects one signal from a first signal group including a first signal and a first constant envelope signal to obtain a first selected signal;

a second switch that selects one signal from a second signal group including a second signal, a second constant envelope signal, and a pseudo noise signal with a larger bandwidth than the second signal, to obtain a second selected signal;

a first estimator that estimates a first characteristic difference between the first selected signal and the output signal when the second switch selects the second constant envelope signal;

a second estimator that estimates a second characteristic difference between the second selected signal and the output signal when the first switch and the second switch select the first constant envelope signal and the pseudo noise signal, respectively;

a calculator that calculates a correction amount for a characteristic of at least one of the first and second selected signals based on the first characteristic difference and the second characteristic difference; and a corrector that uses the correction amount to correct the characteristic of at least one of the first and second selected signals to obtain the first input signal and the second input signal.

* * * * *